(12) United States Patent
Kobayashi

(10) Patent No.: US 11,462,486 B2
(45) Date of Patent: Oct. 4, 2022

(54) SEMICONDUCTOR DEVICE AND METHOD FOR MANUFACTURING SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Hitoshi Kobayashi, Yamato Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 15 days.

(21) Appl. No.: 16/797,947

(22) Filed: Feb. 21, 2020

(65) Prior Publication Data

US 2021/0013157 A1 Jan. 14, 2021

(30) Foreign Application Priority Data

Jul. 10, 2019 (JP) .............................. JP2019-128554

(51) Int. Cl.
*H01L 23/544* (2006.01)
*H01L 23/00* (2006.01)
(Continued)

(52) U.S. Cl.
CPC ........ *H01L 23/562* (2013.01); *H01L 21/0272* (2013.01); *H01L 21/6836* (2013.01);
(Continued)

(58) Field of Classification Search
CPC ............... H01L 23/562; H01L 21/0272; H01L 21/6836; H01L 21/78; H01L 23/544;
(Continued)

(56) References Cited

U.S. PATENT DOCUMENTS

| 9,704,750 B2 | 7/2017 | Rupp et al. |
| 2016/0028367 A1* | 1/2016 | Shealy ............... H03H 9/174 |
| | | 310/321 |
| 2019/0267774 A1* | 8/2019 | Sato ................ H01S 5/183 |

FOREIGN PATENT DOCUMENTS

| JP | 2002076326 A | 3/2002 |
| JP | 2005302816 A | 10/2005 |

* cited by examiner

*Primary Examiner* — Thanh T Nguyen
(74) *Attorney, Agent, or Firm* — Kim & Stewart LLP (57) ABSTRACT

A semiconductor device includes a first semiconductor layer having a first surface and a second surface. A first metal film is disposed on the first surface. An outer portion of the first surface beyond an outer periphery of the first metal film is left uncovered by the first metal film. A semiconductor substrate has an inner region of a first thickness and a peripheral region of a second thickness, greater than the first thickness. A portion of the first semiconductor layer is between the inner region and the first metal layer. The peripheral region of the semiconductor substrate is below the outer portion of the first surface of the first semiconductor layer. A second metal film is below the inner region of the semiconductor substrate and adjacent to the peripheral region of the semiconductor substrate.

17 Claims, 5 Drawing Sheets

(51) Int. Cl.
*H01L 21/027* (2006.01)
*H01L 21/78* (2006.01)
*H01L 21/683* (2006.01)

(52) U.S. Cl.
CPC ............ *H01L 21/78* (2013.01); *H01L 23/544* (2013.01); *H01L 2221/68327* (2013.01); *H01L 2223/5446* (2013.01)

(58) Field of Classification Search
CPC ... H01L 2221/68327; H01L 2223/5446; H01L 21/6835; H01L 2221/6834; H01L 29/0657; H01L 29/41741
See application file for complete search history.

FIG. 2C
(B-B CROSS SECTION)

SEMICONDUCTOR DEVICE AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2019-128554, filed Jul. 10, 2019, the entire contents of which are incorporated herein by reference.

FIELD

Embodiments described herein relate generally to a semiconductor device and a method for manufacturing a semiconductor device.

BACKGROUND

For semiconductor devices such as a low breakdown voltage vertical metal-oxide-semiconductor field-effect transistor (MOSFET), a reduction in thickness of a semiconductor substrate to 10 microns or less is necessary to reduce on-state resistance.

DETAILED DESCRIPTION

Embodiments provide a semiconductor device that has sufficient chip strength while providing reductions in on-state resistance with a thin semiconductor substrate.

In general, according to one embodiment, a semiconductor device comprises a first semiconductor layer having a first surface and a second surface opposite the first surface. A first metal film is on the first surface. An outer portion of the first surface is beyond an outer periphery of the first metal film and is left uncovered by the first metal film. A semiconductor substrate has an inner region of a first thickness, in a first direction orthogonal to the first surface, and a peripheral region of a second thickness, greater than the first thickness, in the first direction. A portion of the first semiconductor layer is between the inner region and the first metal layer in the first direction. The peripheral region of the semiconductor substrate is below the outer portion of the first surface of the first semiconductor layer in the first direction. A second metal film is contacting the semiconductor substrate. The metal film is below the inner region of the semiconductor substrate in the first direction and adjacent to the peripheral region of the semiconductor substrate in a second direction crossing the first direction.

Hereinafter, example embodiments will be described with reference to the drawings. In the following description, the same reference numerals are used in different drawings to indicate the same aspects. An aspect that is described in connection with one figure will not necessarily be repeatedly described for other figures.

In general, in the drawings, the depicted relationships between the thickness and width of portions, and ratios of sizes of different portions are only being schematically illustrated in the drawings, and actual dimensions and dimensional relationships in actual devices are not necessarily limited to those illustrated. Even for identical portions represented in different drawings, the depicted dimensions and ratios may be illustrated differently in each figure.

First Embodiment

Figure 1A:
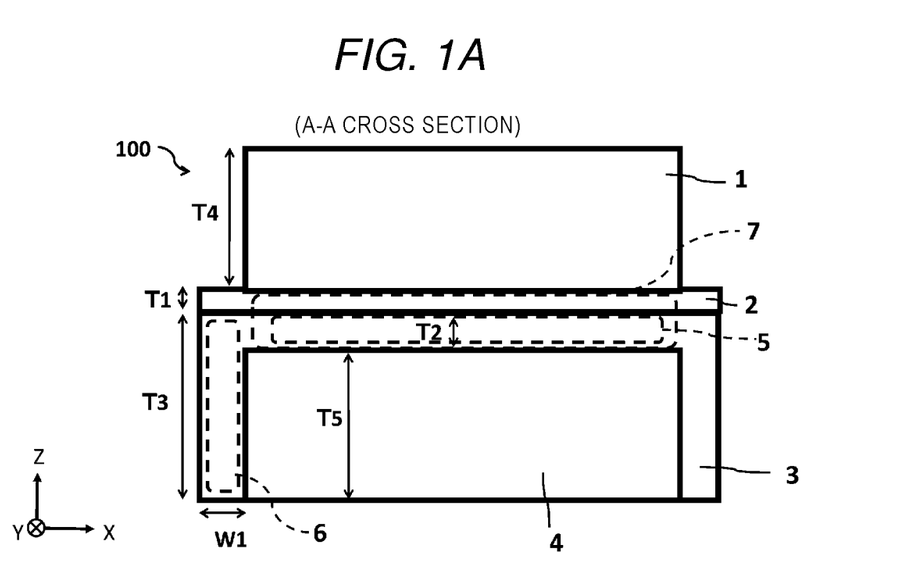
FIG. 1A is a cross-sectional view schematically illustrating a semiconductor device according to a first embodiment.
Figure 1B:
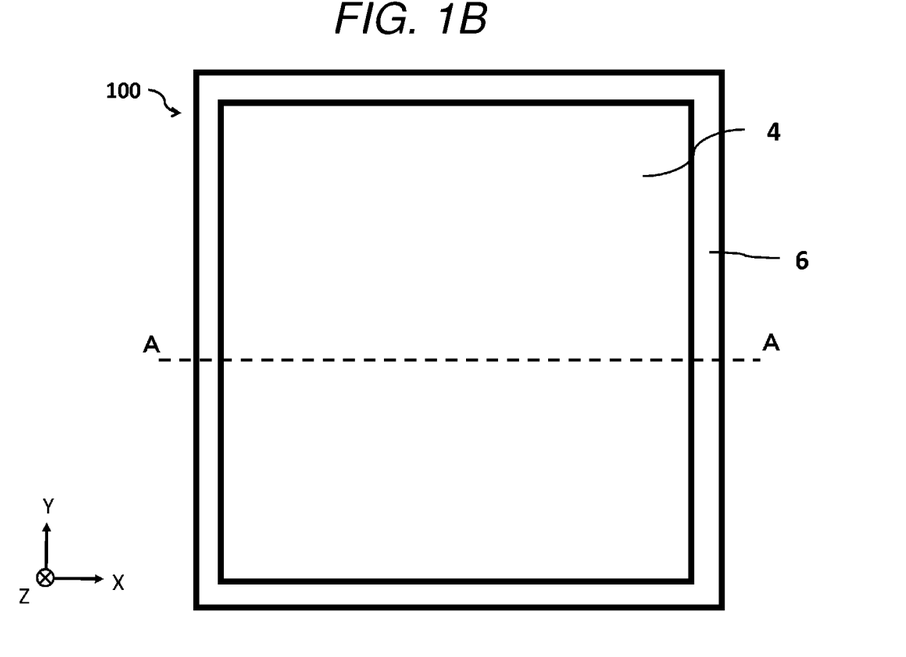
FIG. 1B is a plan view schematically illustrating a rear surface of a semiconductor device according to a first embodiment.

In a semiconductor device 100 of a first embodiment will be described with reference to FIGS. 1A to 1B. FIG. 1A is a cross-sectional view schematically illustrating a configuration of a semiconductor device according to the first embodiment. FIG. 1B is a plan view schematically illustrating a configuration on a rear surface of the semiconductor device according to the first embodiment. An A-A cross section line in FIG. 1B corresponds to the cross-section position of FIG. 1A.

The semiconductor device 100 is, for example, a low breakdown voltage UMOSFET (vertical trench MOSFET). As illustrated in FIG. 1A, the semiconductor device 100 of the first embodiment has a first semiconductor layer 2, a semiconductor substrate 3, a first metal film 1, and a second metal film 4.

The first semiconductor layer 2 is a semiconductor material that has been patterned and is typically formed from an epitaxial film. The first semiconductor layer 2 is formed from a semiconductor material such as silicon (Si), silicon carbide (SiC), or gallium nitride (GaN). The first semiconductor is generally doped with an impurity (also referred to as a dopant). For example, the first semiconductor layer 2 may be formed from silicon containing approximately $10^{15}$ cm$^{-3}$ of phosphorous (P) dopant. In FIG. 1A, the first semiconductor layer 2 has a lower (first) surface and an upper (second) surface opposite to the first surface.

A direction parallel to the lower surface of the first semiconductor layer 2 is referred to as an X direction, and a direction parallel to the lower surface and orthogonal to the X direction is referred to as a Y direction. A direction orthogonal to the X and Y directions is referred to as a Z direction. The lower surface of the first semiconductor layer 2 in the Z direction of FIG. 1 may be referred to as a rear surface, and the upper surface may be referred to as a front surface.

In the semiconductor device 100, a current flows mainly in the Z direction. Therefore, when the thickness of the first semiconductor layer 2 in the Z direction is reduced, particularly when the thickness of a drift layer is reduced, the on-state resistance of the semiconductor device 100 can be reduced. For example, the first semiconductor layer 2 has a thickness T1 in the Z direction of 2 μm or less. The value of thickness T1 may be set according to the design parameters of the first semiconductor layer 2, the drive voltage of the semiconductor device 100, the thickness of semiconductor substrate 3, and the like.

The semiconductor substrate 3 is a semiconductor material that is in contact with the lower surface of the first semiconductor layer 2 and contains dopant in a higher concentration than that of the first semiconductor layer 2. The semiconductor substrate 3 may be formed, for example, from silicon containing approximately $10^{21}$ cm$^{-3}$ of P dopant or approximately $10^{20}$ cm$^{-3}$ of arsenic (As) dopant. FIGS. 1A and 1B illustrate that the semiconductor substrate 3 has the same planar shape and dimension as that of the first semiconductor layer 2 on an XY plane (See, e.g., FIG. 1B, in a plan view from the Z direction). When dicing occurs as described later, the shape of the semiconductor substrate 3 on the XY plane may be different from that of the first semiconductor layer 2.

On the plane parallel to the X and Y directions of the semiconductor substrate 3, the thickness of an inner portion 5 (region 5) is different from that of a peripheral portion 6 (region 6). The first semiconductor layer 2 and the inner portion 5 of the semiconductor layer 3 that are provided between the first metal film 1 and the second metal film 4 are collectively referred to as a conductor portion 7 (region 7). In the conductor portion 7, a source-to-drain current of the semiconductor device 100 flows. In order to reduce the on-state resistance of the semiconductor substrate 3 portion, a thickness T2 of the inner portion 5 is preferably 10 μm or less. When thickness (T1+T2) of the conductor portion 7 is reduced, the on-state resistance of the semiconductor device 100 is generally reduced. When the thickness (T1+T2) of the conductor portion 7 is 10 μm or less, the on-state resistance of the semiconductor device 100 can be further reduced.

The semiconductor substrate 3 has the extending portion 6 that extends away from the first semiconductor layer 2 in the Z direction. The extending portion 6 has a thickness T3 that is larger than the thickness T2. When the thickness T3 of the extending portion 6 kept greater than several tens of micrometers, the strength of a wafer 110 can be maintained during the processes of manufacturing the semiconductor device 100. The extending portion 6 extends toward the rear surface over the second metal film 4 in the Z direction, or the extending portion 6 on the rear surface side is level with the second metal film 4. In order to satisfy a positional relationship between the extending portion 6 and the second metal film 4, the thickness T3 of the extending portion 6 may be, for example, 20 μm to 50 μm.

A width W1 in the X direction (or the Y direction) of the extending portion 6 may be changed according to a dicing method and/or the design of the semiconductor device 100. The width W1 is, for example, 30 μm to 500 μm. When the width W1 of the extending portion 6 is approximately 30 μm to 500 μm, the extending portion 6 can be prevented from separating from the second metal film 4. Although the first semiconductor layer 2 and the inner portion 5 of the semiconductor substrate 3 of the semiconductor device 100 are especially thin, the semiconductor device 100 still has sufficient strength overall because of the presence of the relatively thick extending portion 6 at the peripheral portion (an outer edge after dicing).

The first metal film 1 functions as an electrode of the semiconductor device 100. The first metal film 1 is provided in contact with the upper surface of the first semiconductor layer 2 or portions thereof. The first metal film 1 is smaller than the first semiconductor layer 2 in the X and Y directions, and is within the planar dimensions of the first semiconductor layer 2 when seen in a plan view from the Z direction. For example, the first metal film 1 is formed by copper (Cu) plating, but the possible processes are not limited to copper plating. The first metal film 1 has a thickness T4 in a range of 10 μm to 40 μm.

The second metal film 4 functions as an electrode of the semiconductor device 100. The second metal film 4 is in contact with the rear surface side of the semiconductor substrate 3 and is embedded between extending portions 6 or within an outer perimeter formed by an extending portion 6 or extending portions 6. For example, the second metal film 4 is formed by copper plating, but the possible processes are not limited to copper plating. The second metal film 4 has a thickness T5 in a range of 10 μm to 40 μm.

Between the first metal film 1 and the second metal film 4, the conductor portion 7, which is particularly thin, is provided. Thus, the semiconductor device 100 has sufficient overall strength. In order to achieve a conductor portion 7 having sufficient strength, it is desirable that the thickness T4 of the first metal film 1 and the thickness T5 of the second metal film 4 each be 10 μm to 40 μm. When the first metal film 1 and the second metal film 4 are each formed from the same type of metal and each has the same thickness, the difference between stresses applied to the conductor portion 7 from the front surface side and the rear surface side can be decreased. When the difference between stresses applied to the conductor portion 7 from the front surface side and from the rear surface side is decreased, cracking due to warping or the like of the conductor portion 7 can be reduced.

In mounting the semiconductor device 100, the extending portion 6 may extend in the downward Z direction beyond the second metal film 4 so long as the second metal film 4 can still be connected to a wiring or the like in later processing. The extending portion 6 may be level with the second metal film 4 on the rear surface side.

An example of a method for manufacturing the semiconductor device 100 of the first embodiment will be described with reference to FIGS. 2A to 2H and FIG. 3. FIGS. 2A to 2H are cross-sectional views schematically illustrating processes of manufacturing the semiconductor device 100 of the first embodiment. FIGS. 2A to 2H are views illustrating two semiconductor devices 100 that are eventually separately obtained by individually picking out parts of the wafer 110 post dicing. At areas adjacent to portions illustrated in FIGS. 2A to 2H, other semiconductor devices 100 may be formed and each. FIG. 3 is a plan view illustrating a rear surface side of the wafer 110 after etching. A B-B cross section line of FIG. 3 corresponds to FIG. 2C.

Figure 2A:
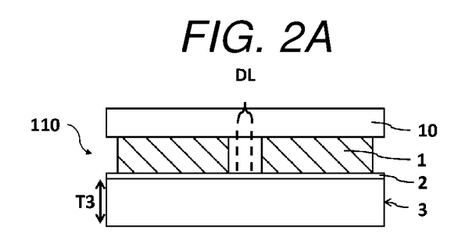
FIGS. 2A to 2H are cross-sectional views schematically illustrating processes of manufacturing a semiconductor device according to a first embodiment.
Figure 3:
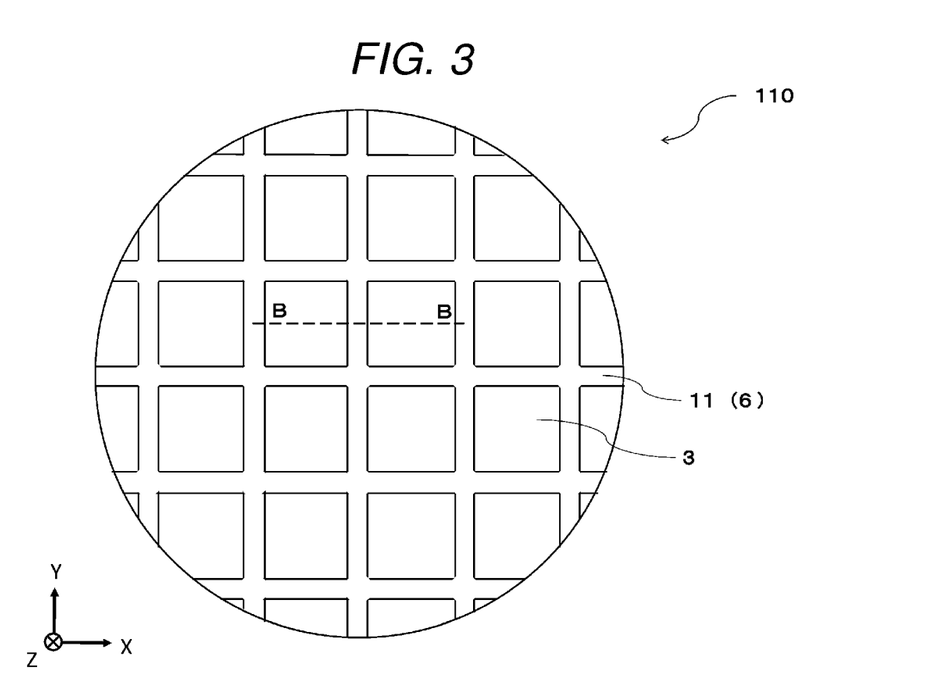
FIG. 3 is a plan view illustrating a rear surface side of a wafer in FIG. 2C.

FIG. 2A illustrates the wafer 110 before processing for formation of the second metal film 4. At this point, the wafer 110 includes the first metal film 1, the first semiconductor layer 2, and the semiconductor substrate 3. The wafer 110 up to this point may be formed, for example, through processes of forming the first semiconductor layer 2 on the semiconductor substrate 3, forming the first metal film 1 and then patterning the first metal film 1 by a lift-off process, and thinning the semiconductor substrate 3. In FIG. 2A, the semiconductor substrate 3 has the overall thickness T3.

A supporting substrate 10 is attached to the upper surface of the first metal film 1 of the wafer 110. The supporting substrate 10 supports the wafer 110, and helps prevent damage to the wafer 110 when stress applied during the manufacturing processes.

On the front surface side of the first semiconductor layer 2, a dicing line DL that shows a position for subsequent dicing is indicated. The dicing line DL may be referred to as a street in some instances. The first metal film 1 is positioned only outside the dicing line DL on the front surface side of the first semiconductor layer 2.

Figure 2B:
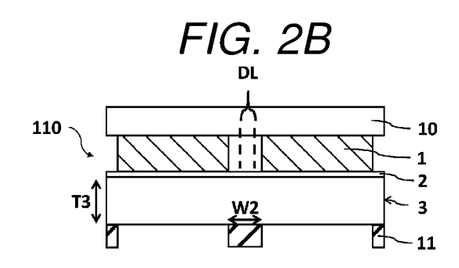

As illustrated in FIG. 2B, a resist pattern 11 is formed, by photolithography or the like, so as to serve as a mask for when the semiconductor substrate 3 is etched. The resist pattern 11 is formed on the rear surface of the semiconductor substrate 3 along a portion of semiconductor substrate 3 corresponding to the dicing line DL. For example, the resist pattern 11 may be formed through processes of applying a photosensitive resist resin to the rear surface of the semiconductor substrate 3 by a spin coating method, drying/baking the resist resin, then performing selective exposure, then developing the latent pattern in a developer solution or the like. The width W2 of the resist pattern 11 is adjusted depending on dicing method, and is generally somewhat larger than the width of the dicing line DL.

Figure 2C:
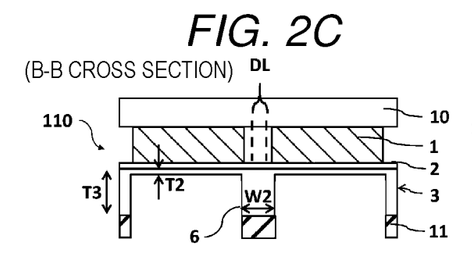

As illustrated in FIG. 2C, a portion of the semiconductor substrate 3 that is left exposed by the resist pattern 11 on the rear surface is etched until the thickness of the semiconductor substrate 3 in the exposed portions reaches the target thickness T2. By this process, the semiconductor substrate 3 is made thin at a position that is inside the perimeter of semiconductor device 100. A portion (or portions) having the thickness T3 is left at those positions where the semiconductor substrate 3 is masked (not etched). That is, a peripheral edge of the semiconductor device 100 remains thick (has thickness T3). This thick portion is the extending portion 6. In this example, a recess is formed for each chip on the wafer 110. The width of the portion (extending portion 6) having the thickness T3 is approximately equal to the width W2 of the resist pattern 11.

In FIG. 3, a reference numeral ("6") is indicated and represents that the extending portion 6 is provided directly under the resist pattern 11, which has a regular mesh shape across the wafer 110. The wafer 110 is thus made partially thin at relevant portions by etching. However, the wafer 110 still has sufficient strength for subsequent processing since the thicker extending portion(s) 6 are provided across the wafer 110 in positions corresponding to the resist pattern 11.

Figure 2D:
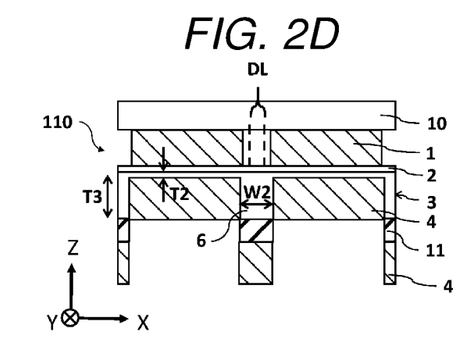

As illustrated in FIG. 2D, over the whole surface on the rear surface side of the wafer 110, that is, on the resist pattern 11 and the semiconductor substrate 3 left exposed by the resist pattern 11, a second metal film 4 having a thickness of 40 μm or less is formed. For example, the second metal film 4 is formed by copper (Cu) plating, but the possible processes are not limited to copper plating.

Figure 2E:
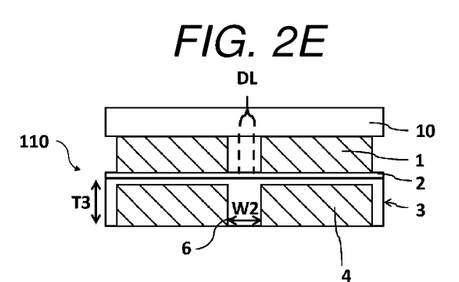

As illustrated in FIG. 2E, the resist pattern 11 is removed/stripped. By this process, the copper plating film formed on the resist pattern 11 is removed and only the second metal film 4 is left between the extending portions 6. The second metal film 4 is in contact with the rear surface of the semiconductor substrate 3. That is, in the recess formed for each chip on the wafer 110, a second metal film 4 is formed.

Figure 2F:
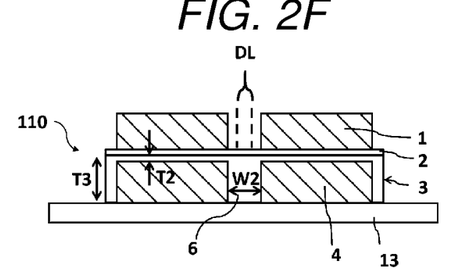
Figure 2G:
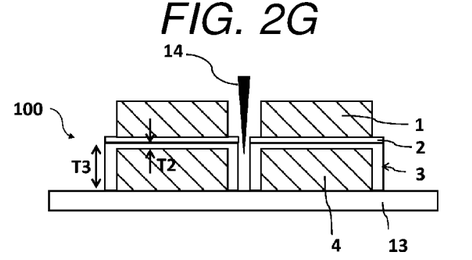

As illustrated in FIG. 2F, the rear surface of the wafer 110 is attached to a dicing tape 13. The dicing tape 13 has an adhesive layer and adheres to the extending portion 6 and the second metal film 4 or, in some examples, only the extending portion 6. The supporting substrate 10 is, at this time, removed from the wafer 110.

As illustrated in FIG. 2F, the wafer 110 that has been attached to the dicing tape 13 is then separated into individual chips (dicing) by removing the portions of the first semiconductor layer 2 and the semiconductor substrate 3 along at least the center region of the dicing line DL. FIG. 2F is an example where the dicing method utilizes a blade dicing with a blade 14 being depicted. The possible dicing methods to be used in this context are not limited to blade dicing, and, for example, a plasma dicing may be used in other examples.

Figure 2H:
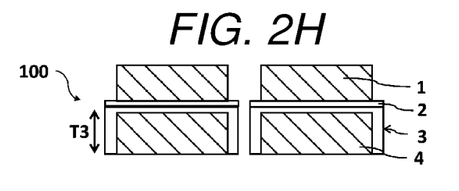

As illustrated in FIG. 2H, each semiconductor device 100 is obtained by removing/separating a chip from the dicing tape 13.

A semiconductor device 800 in Comparative Example (1) and a semiconductor device 900 in Comparative Example (2) will be described. The semiconductor devices 800 and 900 have a conductor portion (comprising the first semiconductor layer 2 and a semiconductor substrate 38 or semiconductor substrate 39) having the same thickness as the conductor portion 7 of the semiconductor device 100 in the first embodiment, and the on-state resistance of these other devices (800 & 900) is intended to be as low as that of the semiconductor device 100. In the descriptions of Comparative Examples (1) and (2), the same reference numerals are used for the components that are substantially the same as those of the first embodiment, and descriptions of repeated aspects may be omitted.

The semiconductor device 800 in Comparative Example (1) will be described with reference to FIGS. 4A to 4C.

Figure 4A:
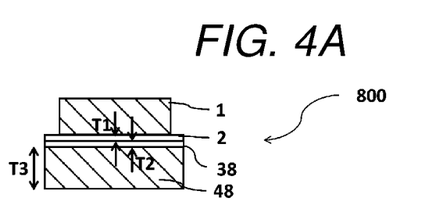
FIG. 4A is a cross-sectional view of a semiconductor device in Comparative Example (1).

FIG. 4A is a cross-sectional view of the semiconductor device 800 in Comparative Example (1). In the semiconductor device 800, the thickness T2 of the semiconductor substrate 38 is constant, and a second metal film 48 is provided on the whole rear (lower) surface of the semiconductor substrate 38.

Figure 4B:
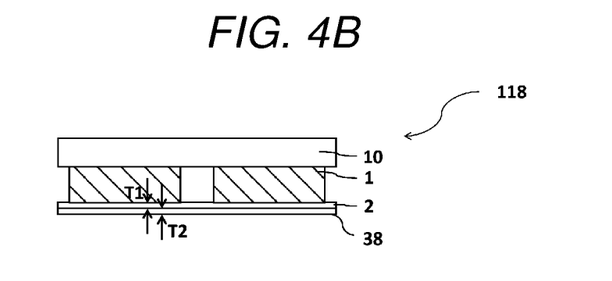
FIG. 4B is a cross-sectional view of a wafer before formation of a second metal film in Comparative Example (1).

FIG. 4B is a cross-sectional view of a wafer 118 before formation of the second metal film 48 in Comparative Example (2). FIG. 4B corresponds to FIG. 2A. In the wafer 118 before dicing in this Comparative Example (1), the thickness T2 of the semiconductor substrate 38 is constant in all regions/positions.

Figure 4C:
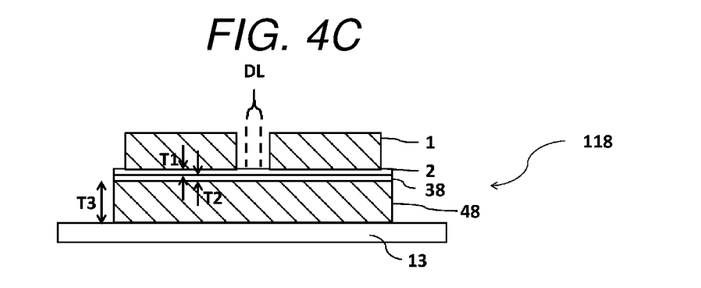
FIG. 4C is a cross-sectional view of a wafer before dicing in Comparative Example (1).

FIG. 4C is a cross-sectional view of the wafer 118 before dicing in Comparative Example (1). FIG. 4C corresponds to FIG. 2F. The wafer 118 in FIG. 4C is different from the wafer 110 in the first embodiment in that the second metal film 48 is provided on the whole rear surface of the semiconductor substrate 38. In dicing of the wafer 118 in FIG. 4C, the second metal film 48 will be removed (that is, the dicing processing must cut or otherwise separate portions of the second metal film 48 from each other).

The semiconductor device 900 in Comparative Example (2) will be described with reference to FIGS. 5A to 5C.

Figure 5A:
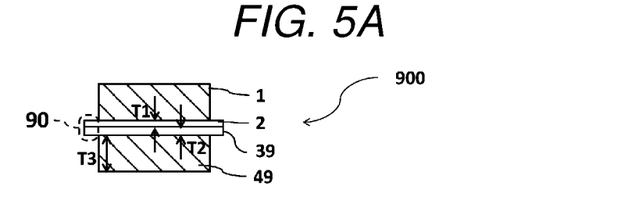
FIG. 5A is a cross-sectional view of a semiconductor device in Comparative Example (2).

FIG. 5A is a cross-sectional view of the semiconductor device 900 in Comparative Example (2). The semiconductor device 900 is different from the semiconductor device 100 in that the thickness T2 of a semiconductor substrate 39 is constant in all regions. For the first semiconductor layer 2 and the semiconductor substrate 39, there is a tip portion 90 (also referred to as an edge portion) that protrudes in the X direction (and likewise the Y direction) beyond outer edges of the first metal film 1 and the second metal film 49.

Figure 5B:
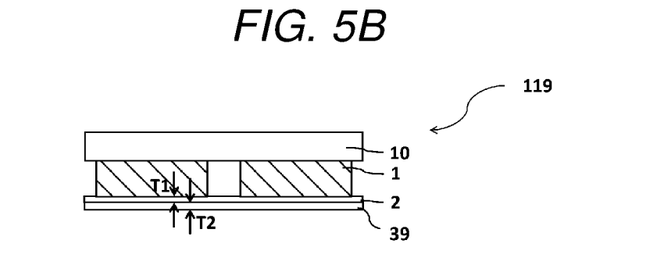
FIG. 5B is a cross-sectional view of a wafer before formation of a second metal film in Comparative Example (2).

FIG. 5B is a cross-sectional view of a wafer 119 before formation of the second metal film 49 in Comparative Example (2). FIG. 5B corresponds to FIG. 2A. In the wafer 119 before dicing in this Comparative Example, the thickness T2 of the semiconductor substrate 39 is constant in all regions/portions. The wafer 119 is thus different from the wafer 110 in the first embodiment.

Figure 5C:
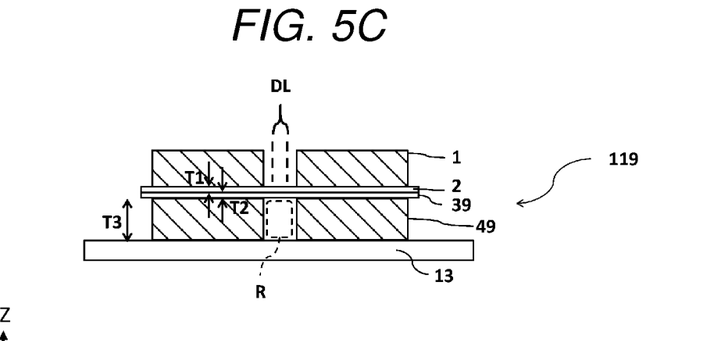
FIG. 5C is a cross-sectional view of a wafer before dicing in Comparative Example (2).

FIG. 5C is a cross-sectional view of the wafer 119 before dicing in Comparative Example (2). FIG. 5 is a cross-sectional view corresponding to FIG. 2F. Between the portion of the semiconductor substrate 39 to be removed by dicing and the dicing tape 13 below, there is a space R having the same thickness as that of the second metal film 49. When using a blade dicing method, the blade will come into contact with the first semiconductor layer 2 and the semiconductor substrate 39 from the front surface side, but the semiconductor substrate 39 is not substantially supported from the rear surface side in those positions corresponding to the dicing line DL. Therefore, the semiconductor substrate 39 will be pressed toward the space R and deformed. The cross-sectional area of the portions of the first semiconductor layer 2 and the semiconductor substrate 39 that will be pressed by the blade will be smaller than that occurring in the processing of semiconductor device 100. Therefore, a shear stress applied to this portion during dicing is increased. That is, the magnitude of force applied in a direction parallel to the cross section of the portion per unit cross-sectional area increases.

The first semiconductor layer 2 and the semiconductor substrate 39 are very thin. Therefore, the first semiconductor layer 2 and the semiconductor substrate 39 are likely to be cracked or broken due to the stress applied during manufacturing, resulting in damage and reduced product yield.

When the first semiconductor layer 2 and the conductor portion 7 of the semiconductor substrate 3 are made thin, the on-state resistance of the semiconductor device 100 can be reduced. However, when the semiconductor substrate 3 is made thinner, it becomes weaker and more susceptible to stresses from any direction. Therefore, the risk of cracking during handling and manufacturing is increased. Potential reductions in possible mechanisms for damage during handling and/or manufacturing of the semiconductor device 100 will be described by comparison to the Comparative Examples (1) and (2).

First, probabilities of damaging the first semiconductor layer 2 and the semiconductor substrate 3/38/39 before formation of the second metal film 4/48/49 in cases where the extending portion 6 is not formed (e.g., as in Comparative Examples (1) and (2)) is compared to a case in which the extending portion 6 is formed (e.g., as in the first embodiment).

The wafer 118 (see FIG. 4B) in Comparative Example (1) and the wafer 119 (see FIG. 5B) in Comparative Example (2) will be described. In FIGS. 4B and 5B, the adjacent first metal films 1 are connected through the first semiconductor layer 2 and the semiconductor substrate 38 (or substrate 39). A connection portion of the wafer 118 (or wafer 119) that are a part of the thin first semiconductor substrate 2 and the thin semiconductor substrate 38 (or substrate 39) is likely to be cracked due to a stress applied in a manufacturing process.

In the wafer 110 of the first embodiment before formation of the second metal film 4, the thick extending portion 6 is provided in a mesh shape over the entire wafer 110. The wafer 110 is thus reinforced by presence of the extending portion 6, and therefore the wafer 110 is less likely to be cracked due to stress applied in manufacturing.

Next, probabilities of damaging the first semiconductor layer 1 and the semiconductor substrate 3/38/39 in a case where a metal material is removed in the dicing process (as in Comparative Example (1)) and a case where a metal material is not removed in the dicing process (as in the first embodiment) are compared.

The wafer 118 (see FIG. 4B) of Comparative Example (1) will be described. In dicing (whether with a blade dicing or in plasma dicing process), it is considered more difficult to remove a metal material (such as copper) than to remove a semiconductor material (such as silicon). For the wafer 118 in Comparative Example (1), portions of the second metal film 48 need to be removed in the dicing. In Comparative Example (1), the dicing is thus comparatively difficult. Particularly with blade dicing, removal of the second metal film 48 may cause an increase in stress applied to the wafer 118 and vibrations. The increase in stress and the increased vibrations may cause damage to the thin first semiconductor layer 2 and the thin semiconductor substrate 38.

In the first embodiment, the second metal film 4 is not provided in the regions to be removed in the dicing process. Therefore, the wafer 110 is more easily diced into individual pieces. The stress applied to the wafer 110 and the vibrations associated with dicing can be reduced, and damage to the first semiconductor layer 2 and the semiconductor substrate 3 can be prevented.

Next, probabilities of damaging the first semiconductor layer 2 and the semiconductor substrate 3/38/39 in a case where there is the space R (void) left between the dicing tape 13 and the portions to be removed by the dicing (as in Comparative Example (2)) and a case where there is no space R (as in the first embodiment) during the dicing process are compared to each other.

The wafer 119 (see FIG. 5B) of Comparative Example (2) will be described. In a blade dicing method, the blade comes into contact with the first semiconductor layer 2 and the semiconductor substrate 39 from the front surface side, the semiconductor substrate 39 is pressed toward a side opposite to the blade (towards the rear surface side). When there is the space R on the rear surface side as with semiconductor substrate 39 of the wafer 119 in Comparative Example (2) then the semiconductor substrate 39 is not supported. Therefore, the first semiconductor layer 2 and the semiconductor substrate 39 of the wafer 119 are pressed toward the space R, bent, and deformed.

The wafer 119 is deformed, and so the shear stress applied to the first semiconductor layer 2 and the semiconductor substrate 39 is increased. As a result, the first semiconductor layer 2 and the semiconductor substrate 39 are likely to be cracked. The surface generated by cracking of the semiconductor substrate 39 includes many small chips and fractures, and the cracked surface may thus be further broken in later processing or the like, resulting in further damage. Therefore, dicing is considered more difficult for Comparative Example (2). In the semiconductor device 900 after dicing, the tip 90 at which the first semiconductor layer 2 and the semiconductor substrate 39 that are thin and fragile is left to protrude in the X direction (the Y direction). When the protruding tip 90 comes into contact with a manufacturing device or the like during subsequent handling such as die pickup, the first semiconductor layer 2 and the semiconductor substrate 39 may be further cracked and broken.

In the first embodiment, the extending portion(s) 6 of the semiconductor substrate 3 are provided, thus the portions being removing in the dicing by the blade are supported during the dicing process. Thus, even when the semiconductor substrate 3 is being pressed with the blade 14 during dicing, the semiconductor substrate 3 remains supported by at least the dicing tape 13, and therefore the semiconductor substrate 3 is unlikely to be deformed.

In the first embodiment, the thickness T3 of the semiconductor substrate 3 at the portion that is to be removed by dicing is greater than the thickness T2 of the semiconductor substrate 39 at the portion that is removed by dicing in Comparative Example (2). That is, in the first embodiment, the cross-sectional thickness of the area that is pressed with the blade is greater, and therefore the shear stress (the magnitude of force applied in a direction parallel to the cross section per unit cross-sectional area) is reduced.

In the first embodiment, the semiconductor substrate 3 is unlikely to be deformed, and the applied shear stress will be low. Therefore, the first semiconductor layer 2 and the semiconductor substrate 3 are unlikely to be cracked. Further, a tip 90 portion is not formed in the semiconductor device 100. Therefore, a probability of damage due to breakage of the tip 90 during handling is low.

According to the first embodiment, the semiconductor device 100 has a conductor portion 7 that includes the thin first semiconductor layer 2 and the thin inner portion 5 of the semiconductor substrate 3, and thus has low on-state resistance. The semiconductor device 100 also has the first metal film 1 and the second metal film 4, between which the first semiconductor layer 2 and the semiconductor substrate 3 are provided, and the extending portion 6, which is a peripheral portion of the semiconductor substrate 3. The extending portion 6 has a thickness greater than the inner portion 5. The strength of the semiconductor device 100 is enhanced because of the presence of the first metal film 1, the second metal film 4, and the extending portion 6, and the probability of the first semiconductor layer 2 and the semiconductor substrate 3 being damaged due to stress is reduced.

According to the first embodiment, a semiconductor device that has sufficient chip strength while still providing a sufficiently low on-state resistance can be provided. A method for manufacturing such a semiconductor device is also provided.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device, comprising:
a first semiconductor layer having a first surface and a second surface opposite the first surface;
a first metal film on the first surface, an outer portion of the first surface beyond an outer periphery of the first metal film being left uncovered by the first metal film;
a semiconductor substrate having an inner region of a first thickness in a first direction orthogonal to the first surface and a peripheral region of a second thickness, greater than the first thickness, in the first direction, a portion of the first semiconductor layer being between the inner region and the first metal film in the first direction, the peripheral region of the semiconductor substrate being below the outer portion of the first surface of the first semiconductor layer in the first direction; and
a second metal film contacting the semiconductor substrate, the second metal film being below the inner region of the semiconductor substrate in the first direction and adjacent to the peripheral region of the semiconductor substrate in a second direction crossing the first direction, the second metal film directly contacting the peripheral region from the second direction and the inner region from the first direction.

2. The semiconductor device according to claim 1, wherein the first metal film has a planar shape corresponding to a planar shape of the semiconductor substrate.

3. The semiconductor device according to claim 1, wherein the first thickness is less than or equal to 10 μm or less and the second thickness is less than or equal to 50 μm.

4. The semiconductor device according to claim 3, wherein the second metal film has a thickness in the first direction of less than or equal to 40 μm.

5. The semiconductor device according to claim 1, wherein the first metal film and the peripheral region of the semiconductor substrate do not overlap along the first direction.

6. The semiconductor device according to claim 1, wherein the first semiconductor layer and the semiconductor substrate have different impurity concentrations.

7. The semiconductor device according to claim 1, the first metal film and the second metal film are the same thickness.

8. The semiconductor device according to claim 7, wherein the first metal film and the second metal film are formed of the same type of metal.

9. The semiconductor device according to claim 1, wherein the first metal film and the second metal film are formed of the same type of metal.

10. The semiconductor device according to claim 1, wherein the peripheral region has a width in the second direction of between 30 μm and 500 μm.

11. The semiconductor device according to claim 1, wherein the second metal film is embedded in a recess formed in the semiconductor substrate between portions of the peripheral region that are separated from each other in the second direction.

12. The semiconductor device according to claim 11, wherein the second metal film entirely fills the recess between the portions of the peripheral region.

13. The semiconductor device according to claim 1, wherein the second metal film entirely covers a bottom surface of the inner region of the semiconductor substrate.

14. The semiconductor device according to claim 13, wherein the second metal film is in direct contact with the bottom surface of the inner region.

15. The semiconductor device according to claim 1, wherein the peripheral region extends in the first direction to a position level with a position of a bottom surface of the second metal film.

16. The semiconductor device according to claim 1, wherein the inner region is directly connected to the peripheral region.

17. The semiconductor device according to claim 1, wherein a planar shape of the first metal film substantially matches a planar shape of the second metal film when viewed from the first direction.

* * * * *